United States Patent [19]

Lloyd et al.

[11] 4,397,021

[45] Aug. 2, 1983

[54] MULTI-PROCESSOR AUTOMATIC TEST SYSTEM

[75] Inventors: Raymond A. Lloyd, Laurel; Derek B. Eckert, Cockeysville; Theodore B. Stagg, Jr., Jarrettsville, all of Md.

[73] Assignee: Westinghouse Electric Corp., Pittsburgh, Pa.

[21] Appl. No.: 273,720

[22] Filed: Jun. 15, 1981

[51] Int. Cl.³ .................... G01R 31/28; G06F 11/00
[52] U.S. Cl. .................................. 371/20; 364/580; 364/900
[58] Field of Search ................... 371/20, 16, 25; 364/579, 580, 200, 900; 324/73 R, 73 AT, 73 PC

[56] References Cited

U.S. PATENT DOCUMENTS

| | | | |
|---|---|---|---|
| 3,694,632 | 9/1972 | Bloomer | 364/579 |
| 4,125,763 | 11/1978 | Drabing et al. | 371/20 |
| 4,287,594 | 9/1981 | Shirasaka | 371/20 |
| 4,300,207 | 11/1981 | Eivers et al. | 364/900 |
| 4,313,200 | 1/1982 | Nishiura | 371/20 |
| 4,339,819 | 7/1982 | Jacobson | 371/16 |
| 4,348,759 | 9/1982 | Schnurmann | 371/20 |

Primary Examiner—Charles E. Atkinson
Attorney, Agent, or Firm—J. B. Hinson

[57] ABSTRACT

A test system utilizing a plurality of programmable test instruments each capable of executing portions of a test program with the test program being written in a compiler language such as ATLAS, for example, is disclosed. Programs specifying the tests to be performed are written in a compiler language such as ATLAS and transferred to a central control processor utilizing standard peripheral equipment. The central control processor communicates with a plurality of test instruments utilizing a series of data busses. In executing the test program, the control processor first segments the program into a series of individual tests to be performed. The test instruments are interrogated to determine which of the test instruments is currently capable of executing a specific sequence of the test program. Once an instrument has been identified which can execute the program segment, the control process transfers that segment to the instrument capable of executing the test. After a test has been executed, the programmable test instrument executing the test transfers the result of the test back to the central control processor for analysis. In addition to performing the basic test, each of the instruments also has access to the switching matrix so that the required interconnects between the system being tested and the test instruments can be made under the control of the test instrument itself. Functionally, each of the test instruments accepts segments of the overall test program in a compiler language and performs all the functions necessary to execute that segment of the program and transfer the test results to the central processor. The function of the central processor is to control the system, allocate portions of the program to each of the test instruments and analyze the final test result. Alternate embodiments provide means permitting any one of the programmable test instruments to assume control of the entire system.

7 Claims, 4 Drawing Figures

MULTI-PROCESSOR AUTOMATIC TEST SYSTEM

STATEMENT OF GOVERNMENT INTEREST

This invention was either conceived or first reduced to practice under Air Force Contract No. F33657-78-C-0503.

BACKGROUND OF THE INVENTION

Field of the Invention

The invention relates to test systems and more specifically to a computerized test system in which a plurality of instruments each having associated therewith a dedicated programmable processor, each dedicated processor communicating with a central computer for the purpose of transferring test program instructions written in a high level compiler language to the instrument for execution.

SUMMARY OF THE INVENTION

The invention comprises a test system and the method of operating such a system. Tests to be performed are specified by a digital computer program written in a compiler language such as "ATLAS", for example. A central control computer is programmed by transferring the program from suitable peripheral device to the memory of the central computer. A plurality of programmable test devices capable of executing program segments, written in the compiler language are coupled to communicate with the central processor. Segments of the test program, in the compiler language, are transferred from the central processor to the programmable test devices for execution and the results of the test are returned to the central processor for analysis.

DETAILED DESCRIPTION

Figure 1:
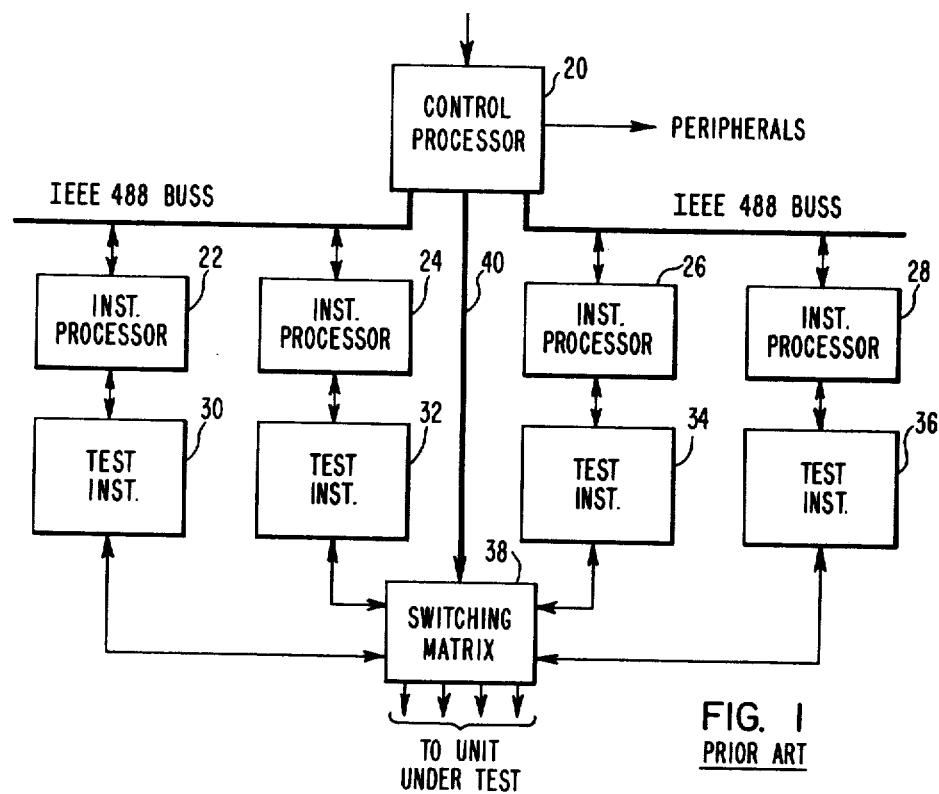
FIG. 1 is a block diagram of a typical prior art system.

FIG. 1 is a functional block diagram of a typical prior art test system. The system described in the prior art and illustrated in FIG. 1 is basically the system which is the subject of U.S. patent application Ser. No. 229,029, which is assigned to the same assignee as the instant application. The system includes a central control processor 20 which may be of a general purpose type. The control processor 20 communicates with instrument processors 22, 24, 26 and 28, via standard IEEE 488 data busses. Instrument processors 22, 24, 26 and 28, are typically fixed program processors limited to executing programs from a read-only memory for storing permanent programs with only sufficient programming provided to operate the test instruments to which the individual processors are coupled. For example, instrument processor 22 is coupled to a first instrument 30 to control this instrument to perform desired tests. Similarly, instrument processors 24, 26 and 28 communicate with test instruments 32, 34 and 36. As is common, a switching matrix 38 is provided which couples the test instruments and signals to the unit under test. The switching matrix 38 is operated via an independent bus 40 by the control computer 20.

In the system in FIG. 1, the control processor 20 must process each of the test sequence specified by the program and separates the program instructions specifying each test into two parts, one which goes to the various instrument processors and the other which controls the switching matrix 38. In a typical test system, the switching matrix 38 would require at least two separate instructions at the start of the test, for example, an "open" and a "connect" command of the type found in ATLAS programming and at the end of the test, an "open" and a "disconnect" instruction. In most cases executing the "open", "close", "connect" and "disconnect" instructions may require significant time and data manipulation when compared to the execution time and data manipulation required to execute the individual test instructions by the instrument processor 26. Thus, as previously noted, the control computer 20 must separate each of the instructions into two parts, one part which it executes and the other part which is transferred to the instrument processors for execution and process the results of all tests. This type of operation requires considerable bookkeeping as well as lost time in transferring data during each test sequence. The net result of this mode of operation is a central processor 20 which is relatively complex and a system which may run relatively slow due to the complexity of the data handling task performed by the control processor 20.

Figure 2:
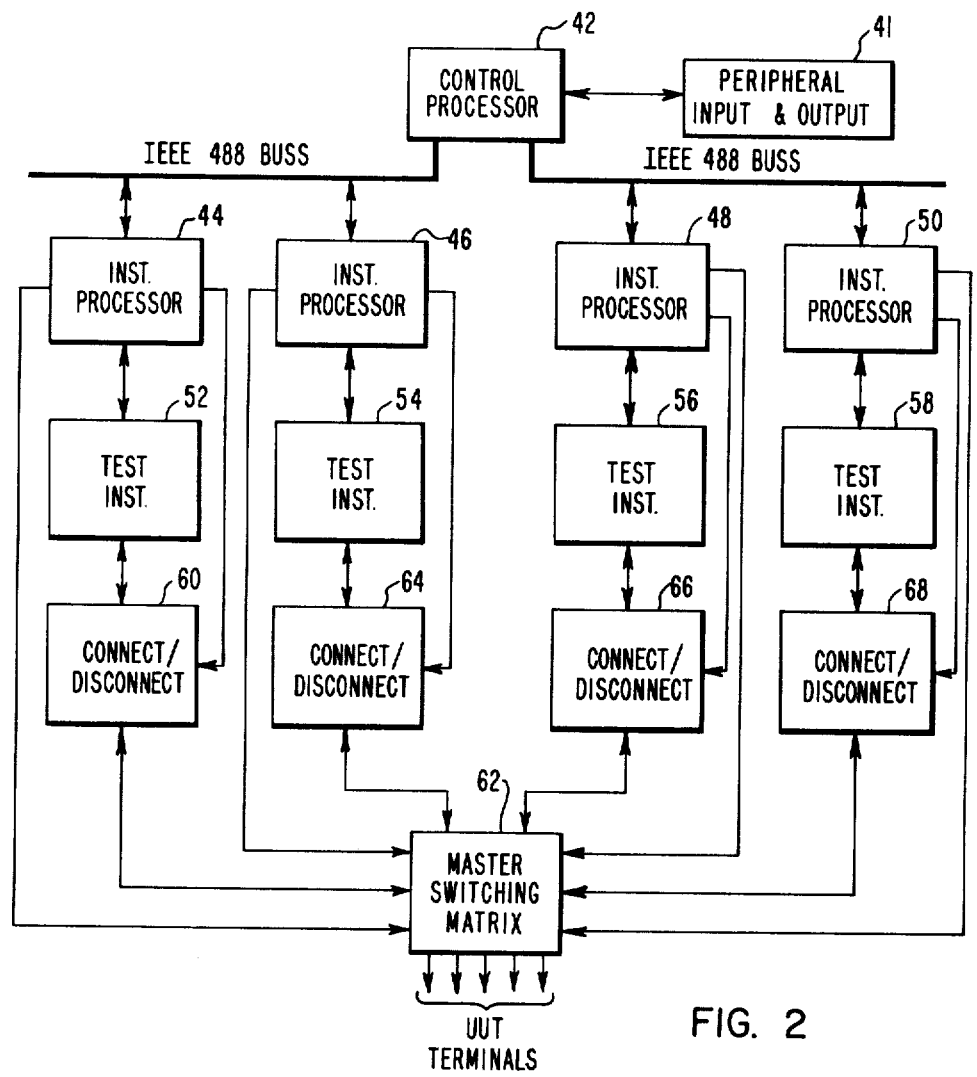
FIG. 2 i a block diagram of an embodiment of the invention.

FIG. 2 is a block diagram of a first embodiment of the invention. The process (method) used to execute typical test sequences written in a compiler language, such as ATLAS, is for the control processor 42 to transfer a complete ATLAS test statement including switching commands to the instrument processor for execution.

This embodiment includes a central control processor 42 which communicates with appropriate peripheral devices 41 via appropriate data busses. Additionally, a plurality of exemplary instrument processors 44, 46, 48 and 50 communicates with the control processor 42 via appropriate data busses, for example, a standard IEEE 488 data bus. The communication path between the control processor and the instrument processor, will in general, include both programs and data and be bi-directional. For example the control processor 42 may interrogate an instrument processor to determine if the interrogated processor is currently executing a test or if its associated test instrument has the capability of performing a specific test. Each of the instrument processors 44, 46 and 48 includes a read-only memory for storage of a base (essentially permanent) program which is indefinitely retained in the processor. Each of the instrument processors 44, 46, 48 and 50 also includes a random access processor alterable memory for other programming and data processing functions. "Processor alterable" refers to any storage device permitting data to be stored therein or read therefrom under the control of an associated digital processor.

Associated with each of the instrument processors 44, 46, 48 and 50 is a test instrument 52, 54, 56 and 58. The test instruments are selected to perform the desired function. Exemplary test instruments include but are not limited to voltmeters, frequency meters. In the sense used herein the term "test instrument" includes signal sources such as voltage, frequency sources, for example. Switching apparatus for selectively coupling the test instruments to the unit under test is divided into two parts labeled connect/disconnect and the master switching matrix. Both of these switching functions are controlled by the instrument processors 44, 46, 48 and 50. For example, the instrument processor 44 has associated therewith a connect/disconnect matrix 60. The output of the connect/disconnect matrix 60 is coupled into the master switching matrix 62 to couple the first test instrument 52 to the appropriate terminals of the unit under test. It is contemplated that conflicts between the various instrument processors will be avoided by dividing the master switching matrix 62 into segments with each of the exemplary instrument processors 44, 46, 48 and 50 being given access only to a portion of the terminals of the unit under test. Instrument processors 46, 48 and 50 are similarly coupled to individual connect/disconnect matrices 64, 66 and 68. Other arrangements, such as a data bus between all of the instrument processors 44, 46, 48 and 50 could also be used to resolve priority conflicts allowing more than one of the instrument processors 44, 46, 48 and 50 to have access to the same terminal of the unit under test on a time shared basis.

Operationally, the system illustrated in FIG. 2 accepts test programs from suitable peripherals 41 and a high level language, for example "ATLAS". The control processor 44 subdivides the ATLAS program into segments with each segment specifying a test to be performed or the signals to be coupled to the unit under test for the purpose of performing operational test. Once the test to be performed and the portion of the program specifying the test have been identified, the central processor 42 will interrogate all of the instrument processors 44, 46, 48 and 50 to determine which of these instrument processors and its associated test instrument has the capability of performing the required tests and is not currently busy. After identifying an instrument processor capable of handling the program segment, the program segment will be routed to the instrument processor to perform the task in the high level language, for example, ATLAS. When the appropriate processor has received the segment or programming, it will proceed to perform the necessary operations to set up the associated test instrument to perform the measurement as well as do all the switching functions to connect the instrument to the unit under test. After the tests are completed, the instrument processor may either perform some analysis on the test results or pass the results back directly to the control processor 42 for further analysis. Under either arrangement, the control processor 42 has been relieved of many of the time consuming tasks associated with prior art systems. For example, the control processor 42 no longer has to subdivide the high level instructions into detailed steps in order to perform the matrix switching. Furthermore, all of the programs can be passed along to the instrument processors in the high level compiler format, for example, ATLAS. This greatly reduces the complexity of the data handling task of the control processor 42 permitting this processor to be simplified. This arrangement also permits the main test program in the compiler language to be portable between systems having different hardware but similar (i.e. interchangeable) capabilities.

Figure 3:
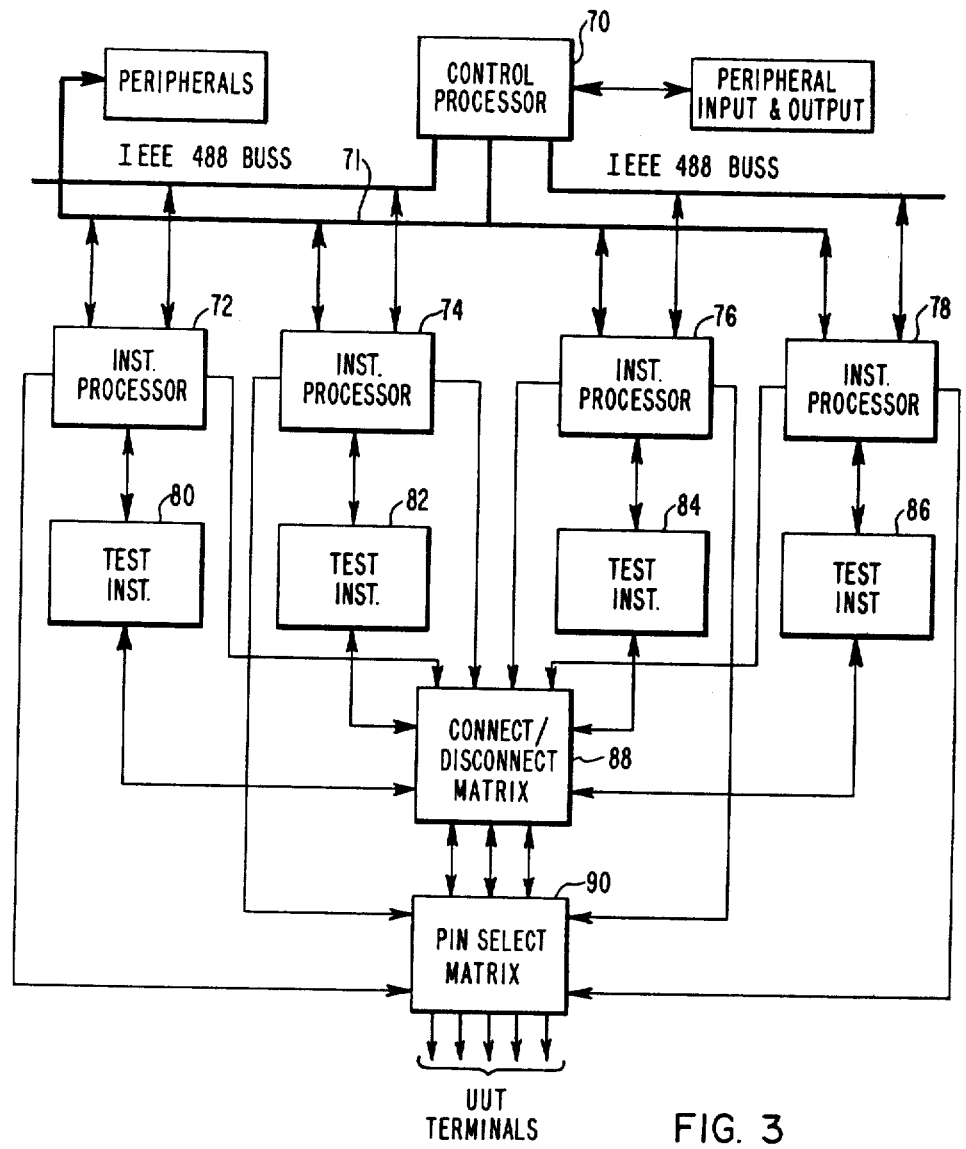
FIG. 3 is a block diagram of another embodiment of the invention.

FIG. 3 illustrates another embodiment of the invention. In this embodiment, a control processor 70 communicates with a plurality of exemplary instrument processors 72, 74, 76 and 78 via standard IEEE 488 busses. As in the previous embodiments, each of the instrument processors 72, 74, 76 and 78 is coupled to operate an associated exemplary test instrument 80, 82, 84 and 86. The connect disconnection functions of the system is provided by a common connect matrix 88 which is coupled to be operated by any of the instrument processors 72, 74, 76 and 78 on a time-shared basis. The connect matrix 88 is coupled to a pin select matrix 90 which is also operable by any of the instrument processors 72, 74, 76 and 78 on a time-shaped basis. Under this arrangement, any test instrument of the system has access to any pen of the unit under test as contrasted to the segmented approach discussed above. Additionally, each of the instrument processors 72, 74, 76 and 78 is coupled to a communications bus 71 permitting them to communicate with each other as well as with the control processor 70. This arrangement permits the system to operate in two modes with the first mode essentially being identical with the one previously described with reference to the system illustrated in FIG. 2 in which the control processor 70 would accept test programs written in a high level compiler language such as ATLAS, for example, and then divide this program into subtask which could be passed on to the appropriate instrument processor for execution with the result of the test returned to the control processor 70. Additionally, the capability of each of the instrument processors 72, 74, 76 and 78 to execute general purpose programs as well as interchange information among themselves and peripheral devices permits either of these instrument processors to assume control of the system thereby substituting for the control processor 70 as well as control the individual test instrument associated therewith. However, it should be emphasized that if it is desired to include sufficient capability to permit one of the instrument processors to assume control of the entire system that additional random access memory may be required and it may also slow down any test which is desired to be performed by the instrument associated with the processor assuming overall control of the system. Alternatively, it is obvious that if the tests normally performed by the test instrument associated with the processor which is assumed system control can also be performed by one of the other test processors included in the system, that the execution of all test functions by the processor which assumes control could be switched to other portions of the system. It is also obvious that this type of rearranging of responsibilities among the various processors can only be accomplished in a system in which each of the test instruments has access to any terminal of the unit under test. Otherwise, the instrument processor assuming control may not be able to assign all of the normal tests performed by the processor to another unit.

Figure 4:
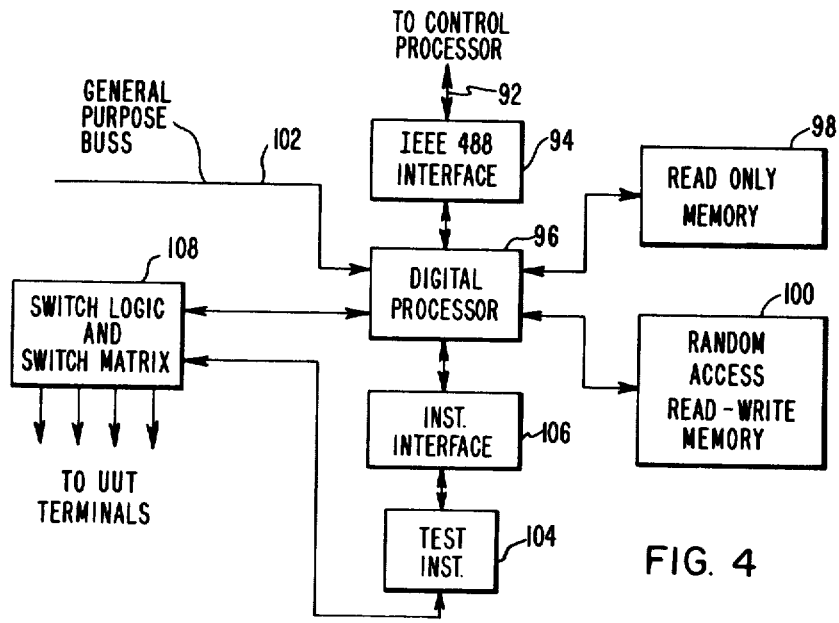
FIG. 4 is a more detailed block diagram of the instrument processor and the associated test instrument.

FIG. 4 is a more detailed diagram of an exemplary programmable test device which includes an instrument processor and associated hardware. In the preferred embodiment, communications with the central processor 90 is via a standard IEEE control bus 92, as previously discussed. The IEEE data bus 92 is coupled to an IEEE interface unit 94 of the type commercially available. A general purpose digital processor, for example, a microprocessor 96, is coupled to the IEEE interface to communicate with the control processor. Permanently retained programs for the digital processor 96 are stored using conventional techniques in a read only memory 98. Storage for temporary programs as well as data processing is provided by a read/write memory 100. General purpose communications for all types of data transfers and system synchronization is provided to the digital processor 96 by a standard general purpose data bus 102 with the details of this bus depending on the detailed design of the digital processor 96. The associated test instrument 104 is coupled to the digital processor 96 by an instrument interface 106 with the design depending on the digital processor 96 as well as the instrument 104. In a typical case, it is also assumed that this interface may also be an IEEE 488 interface.

Associated with the digital processor 96 is also a switch logic 108 which accepts switching instructions from the digital processor 96 to couple the test instrument 104 to the terminals of the unit under test, as required by the program being executed. The switching logic might be no more than a series of flip flops which are used to generate signals which holds the switches of the switching matrix in the desired state during the performance of specific tests. As in previous exemplary embodiments, the test instrument 104 may be a measuring device such as a voltage or frequency meter, or it may be a signal source, such as a voltage or a frequency source.

All of the illustrated embodiments can be assembled using commercially available components and techniques. The necessary programming to utilize the illustrated embodiments will depend on the components selected and is within the capabilities of those skilled in the art. Therefore, no specific hardware or programs have been illustrated.

We claim:

1. A test system comprising:
   (a) a plurality of test instruments each accepting a program specifying test to be performed from a central control processor;
   (b) a control processor communicating with said plurality of test instruments via a data bus;
   (c) interrogate means for enabling said control processor to interrogate each of said plurality of test instruments to determine their status and capability to perform specific test;
   (d) means for enabling said central processor to instruct selected ones of said test instruments to perform a specific test based on an analysis of a specific test to be performed and the capability of said interrogated test instrument to perform test functions.

2. A test system comprising:
   (a) a central control processor for accepting a test program written in a compiler language;
   (b) a plurality of programmable test instruments coupled to receive selected portions of said test program from said central processor;
   (c) a programmable switching matrix selectively coupling said plurality of test instruments to selected terminals of connector means, said connector means providing means for coupling said test system to a unit to be tested;
   (d) means for enabling said central processor to selectively interrogate said programmable test instruments to determine the use status and test capability of interrogated test instruments;
   (e) means for enabling said central processor to initiate a specific programmable test instrument to execute a test specified by a selected portion of said program.

3. A test system comprising:
   (a) a central processor for accepting a program specifying test to be performed, said program being in a compiler language;
   (b) a plurality of programmable test instruments coupled to receive and execute selected portions of said test program;
   (c) means for enabling said central processor to interrogate selected ones of said plurality of programmable digital test instruments to determine the use status of the programmable test instrument interrogated and the test which it is capable of performing;
   (d) means enabling said central processor to transfer portions of said program to a selected programmable test instrument, the selection being made as a result of said central processor interrogating said selected programmable test instrument.

4. A programmable test device comprising:
   (a) a general purpose digital processor;
   (b) read only memory means for storing permanent programs coupled to communicate with said digital processor;
   (c) random access read/write memory for storing non-permanent programs and data coupled to communicate with said digital processor;
   (d) a test instrument coupled to communicate with said digital processor;
   (e) a switching matrix coupled to switch said test instrument to selected terminals of a unit under test under the control of said digital processor; and
   (f) a communication bus for providing programs to said digital processor and for coupling said test device to other systems.

5. A method for operating a test system, comprising the steps of;
   (a) storing a test program written in a compiler language in a central control digital processor;
   (b) coupling a plurality of programmable test devices, capable of executing test programs in said compiler language, to said digital processor;
   (c) segmenting said compiler language program into segments under the control of said digital processor;
   (d) transferring said program segments to one of said programmable test devices for execution of the test specified by said segment, said transfer being under the control of said control processor;
   (e) performing the test specified by said program segment under control of said programmable test device; and
   (f) transferring the results of said test from said programmable test device to said control processor.

6. A test system in accordance with claim 1 wherein each of said plurality of test instruments includes a general purpose communication bus coupled to permit communication between said test instruments and said control processor thereby permitting a selected one of said test instruments to assume the function normally performed by said control processor.

7. A test system in accordance with claim 6 wherein each of said test instruments has access to any terminal of the unit under test thereby permitting the test function of a selected test instrument to be reassigned to another test instrument having similar capabilities.

* * * * *